(12) United States Patent
Ramalingam

(10) Patent No.: US 10,133,668 B2
(45) Date of Patent: Nov. 20, 2018

(54) TECHNOLOGIES FOR PROVIDING CROSS DATA STORAGE DEVICE COMMUNICATIONS

(71) Applicant: Intel Corporation, Santa Clara, CA (US)

(72) Inventor: Anand S. Ramalingam, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 188 days.

(21) Appl. No.: 15/277,377

(22) Filed: Sep. 27, 2016

(65) Prior Publication Data

US 2018/0089081 A1 Mar. 29, 2018

(51) Int. Cl.

| G06F 11/00 | (2006.01) |
|---|---|
| G06F 12/0804 | (2016.01) |
| G11C 16/10 | (2006.01) |
| G11C 16/26 | (2006.01) |
| G11C 14/00 | (2006.01) |

(Continued)

(52) U.S. Cl.
CPC ........ *G06F 12/0804* (2013.01); *G06F 3/0619* (2013.01); *G06F 3/0647* (2013.01); *G06F 3/0653* (2013.01); *G06F 3/0685* (2013.01); *G06F 11/2064* (2013.01); *G06F 11/2094* (2013.01); *G11C 14/0018* (2013.01); *G11C 16/10* (2013.01); *G11C 16/26* (2013.01); *G06F 2201/805* (2013.01); *G06F 2201/82* (2013.01);
(Continued)

(58) Field of Classification Search
CPC ......... G06F 2201/0805; G06F 2201/82; G06F 2212/1008; G06F 2212/1032; G06F 12/0804; G06F 3/0619; G06F 3/0647; G06F 3/0653; G06F 3/0685; G06F 11/2064; G06F 11/2094; G11C 14/0018; G11C 16/10; G11C 16/26

See application file for complete search history.

(56) References Cited

U.S. PATENT DOCUMENTS 8,090,899 B1 * 1/2012 Syu .................. G06F 12/0246
  711/103
8,315,973 B1 11/2012 Kaiser et al.
(Continued)

OTHER PUBLICATIONS

International search report for PCT application No. PCT/US2017/047512, dated Nov. 27, 2017 (3 pages).
(Continued)

*Primary Examiner* — Jason B Bryan
(74) *Attorney, Agent, or Firm* — Barnes & Thornburg LLP

(57) ABSTRACT

Technologies for providing cross data storage device communication include a compute device to transmit, with a processor, a move request to a first data storage device. The first data storage device is to transmit, in response to the move request, a completion notification to the processor. Additionally, the compute device is to read, with the first data storage device, after transmitting the completion notification, a block of data from a first non-volatile memory of the first data storage device to a volatile memory of the compute device. The first data storage device is to transmit to the second data storage device a second move request to move the block of data. The second data storage device is to write the block of data from the volatile memory to a second non-volatile memory of the second data storage device.

25 Claims, 9 Drawing Sheets

(51) Int. Cl.
*G06F 3/06* (2006.01)
*G06F 11/20* (2006.01)

(52) U.S. Cl.
CPC ............... *G06F 2212/1008* (2013.01); *G06F 2212/1032* (2013.01)

(56) References Cited

U.S. PATENT DOCUMENTS

| | | | |
|---|---|---|---|
| 2002/0138676 A1* | 9/2002 | Kendall | G06F 3/0613 710/74 |
| 2009/0190753 A1* | 7/2009 | Watanabe | G11B 20/00086 380/44 |
| 2010/0115193 A1 | 5/2010 | Manus et al. | |
| 2010/0268871 A1 | 10/2010 | Lee et al. | |
| 2015/0103593 A1 | 4/2015 | Su | |
| 2015/0155050 A1 | 6/2015 | Trantham et al. | |
| 2016/0070474 A1* | 3/2016 | Yu | G06F 3/0608 711/103 |
| 2017/0060697 A1* | 3/2017 | Berke | G06F 3/0619 |

OTHER PUBLICATIONS

Written opinion for PCT application No. PCT/US2017/047512, dated Nov. 27, 2017 (4 pages).

* cited by examiner

TECHNOLOGIES FOR PROVIDING CROSS DATA STORAGE DEVICE COMMUNICATIONS

BACKGROUND

Typical data storage devices designed to be compatible with non-volatile memory express (NVMe) (this standard is available at http://www.nvmexpress.org) and peripheral component interconnect express (PCIe) (this standard is available at http://pcisig.com) standards communicate with a host compute device through a programmable memory interface that includes submission queues and completion queues, defined by the NVMe standards body. A processor of the host compute device allocates and assigns message signaled interrupts (e.g., MSI, MSI-X, etc.) and the submission and completion queues in a volatile memory for the data storage devices. To pass requests to a data storage device, the processor writes the request to the submission queue of the data storage device according to a predefined format and notifies the data storage device of the new request by writing an update to the message signaled interrupt. Similarly, upon completion of the request, the data storage device writes a completion status to the completion queue and writes a message signaled interrupt assigned to the processor to notify the processor of the completion of the request.

Typically, when a compute device has multiple data storage devices, such as solid state storage devices (SSDs), to move data between the devices, a host driver executed by the processor performs a read from the source data storage device, stores the read data in volatile memory (e.g., dynamic random access memory), issues a write command to the destination data storage device, waits for completion, and then deallocates and deletes the data from the source data storage device and the volatile memory. A power loss during any of the phases of the process may result in an incoherent move operation. Hence, the processor typically journals the state of the move operation and, if an unexpected power loss occurs, the processor finishes the operations based on the journaled state. Further, each update to or read from the message signaled interrupt is an uncached memory mapped input output (MMIO) operation consuming hundreds of processor cycles. As a result, the processor in typical compute devices incurs significant overhead to manage a move operation between two data storage devices.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
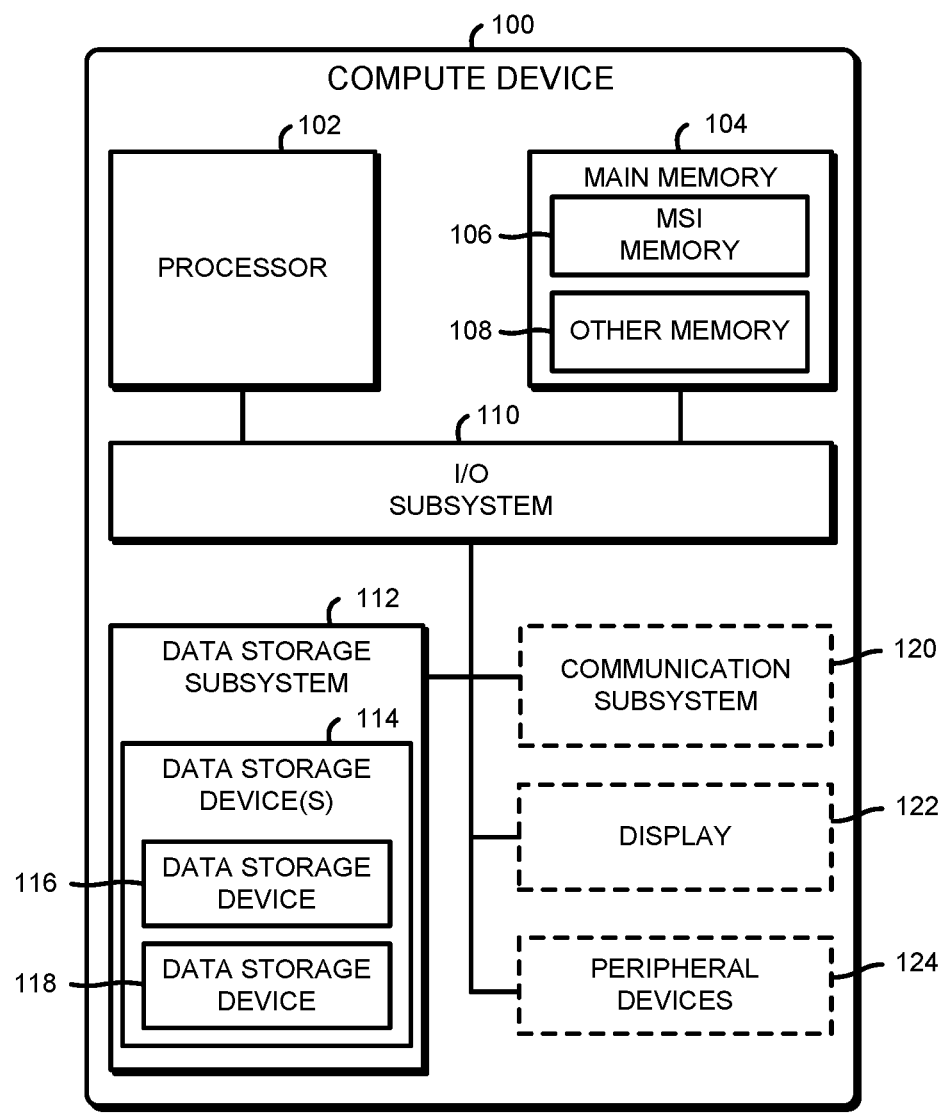
FIG. 1 is a simplified block diagram of at least one embodiment of a compute device that provides cross data storage device communication.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative compute device 100 for providing cross storage device communication may be embodied as any type of compute device capable of performing the functions described herein. For example, in some embodiments, the compute device 100 may be embodied as, without limitation, a computer, a server computer, a laptop computer, a notebook computer, a tablet computer, a smartphone, a consumer electronic device, a smart appliance, and/or any other computing device capable of performing functions to provide cross storage device communication during a move operation. As shown in FIG. 1, the illustrative compute device 100 includes a processor 102, a main memory 104, which includes a message signaled interrupt (MSI) memory 106 and other memory 108, such as volatile memory, an input/output subsystem 110, and a data storage subsystem 112, which includes a set of data storage devices 114, including a data storage device 116 and another data storage device 118. Of course, the compute device 100 may include other or additional components, such as those commonly found in a computer (e.g., communication subsystem, display, peripheral devices, etc.), in other embodiments. Additionally, in some embodiments, one or more of the illustrative components may be incorporated in, or otherwise from a portion of, another component. For example, the memory 104, or portions thereof, may be incorporated in the processor 102 in some embodiments.

In operation, the compute device 100 may assign unique identifiers to each data storage device 114, allocate message signaled interrupts (MSIs) in the MSI memory 106 for each data storage device 114, and allocate queues in the other memory 108 for storing requests and completion status information of the requests. The compute device 100 may further notify each data storage device 114 of the identifiers and MSIs allocated to the other data storage devices 114 to enable communication among the data storage devices 114. Accordingly, the compute device 100 enables each data storage device 114 to communicate requests and completion statuses between themselves during a data block move operation, rather than relying on the processor 102 to coordinate the steps of the operation. Furthermore, the data storage devices 114, in the illustrative embodiment, store information related to move operations in power loss protected memory, such as non-volatile memory, prior to a power loss, thereby enabling the data storage devices 114 to resume a move operation after an unexpected power cycle, without relying on the processor 102 to journal the state of the move operation. As such, in the illustrative embodiment, the processor 102, after issuing a move request to a source data storage device, such as the data storage device 116, the processor 102 is free to perform other operations unrelated to the move operation, resulting in greater efficiency and performance for the compute device 100.

The processor 102 may be embodied as any type of processing device capable of performing the functions described herein. For example, the processor 102 may be embodied as a single or multi-core processor(s) having one or more processor cores, a microcontroller, or other processor or processing/controlling circuit. Similarly, the main memory 104 may be embodied as any type of volatile or non-volatile memory or data storage capable of performing the functions described herein. In operation, the main memory 104 may store various data and software used during operation of the compute device 100 such as storage device identifier data, message signaled interrupt (MSI) data, request submission queue data, operating systems, applications, programs, libraries, and drivers. The main memory 104 is communicatively coupled to the processor 102 via the I/O subsystem 110. Of course, in other embodiments (e.g., those in which the processor 102 includes a memory controller), the main memory 104 may be directly communicatively coupled to the processor 102. In the illustrative embodiment, the main memory 104 includes the MSI memory, which may be embodied as any volatile memory capable of being assigned to devices (e.g., the processor 102, the data storage devices 114) coupled to a bus, such as a PCIe bus, and that when written to, causes an interrupt in the assigned device. It should be understood that the MSI memory may be embodied as standard message signaled interrupt memory, message signaled interrupt extended (MSI-X) memory, or other memory that provides similar functionality. The main memory 104 also includes the other memory 108, which may be embodied as any volatile, non-volatile, or data storage capable of storing the storage device identifier data, request submission queue data, operating systems, applications, programs, libraries, drivers and/or any other data. In the illustrative embodiment, the main memory 104 is accessible through direct memory access (DMA) to enable devices, such as the data storage devices 114, read from and write to the main memory 104 without relying on the processor 102 to act as an intermediary.

The I/O subsystem 110 may be embodied as circuitry and/or components to facilitate input/output operations with the processor 102, the main memory 104, and other components of the compute device 100. For example, the I/O subsystem 110 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 110 may form a portion of a system-on-a-chip (SoC) and be incorporated, along with the processor 102, the memory 104, and other components of the compute device 100, on a single integrated circuit chip.

The data storage subsystem 112 may be embodied as any type of devices configured for short-term or long-term storage of data such as, for example, memory devices and circuits, memory cards, solid-state drives, hard disk drives, or other data storage devices. In the illustrative embodiment, the data storage subsystem 112 includes a set of data storage devices 114 including the data storage device 116 and the data storage device 118, which, in the illustrative embodiment are embodied as NAND-based solid state drives. However, in other embodiments, the data storage devices 114 may be embodied as or include any other memory devices capable of storing data and moving data between themselves. Further, while two data storage devices 114 are shown in FIG. 1, it should be understood that, in other embodiments, the data storage subsystem 112 may include a different number of data storage devices 114. The data storage devices 114 are described in more detail with reference to FIG. 2.

The compute device 100 may also include a communication subsystem 120, which may be embodied as one or more devices and/or circuitry capable of enabling communications with one or more other compute devices. The communication subsystem 120 may be configured to use any suitable communication protocol to communicate with other compute devices including, for example, wireless data communication protocols, cellular communication protocols, and/or wired communication protocols.

Additionally or alternatively, the compute device 100 may include a display 122. The display 122 may be embodied as, or otherwise use, any suitable display technology including, for example, a liquid crystal display (LCD), a light emitting diode (LED) display, a cathode ray tube (CRT) display, a plasma display, and/or other display usable in a compute device. The display may include a touchscreen sensor that uses any suitable touchscreen input technology to detect the user's tactile selection of information displayed on the display including, but not limited to, resistive touchscreen sensors, capacitive touchscreen sensors, surface acoustic wave (SAW) touchscreen sensors, infrared touchscreen sensors, optical imaging touchscreen sensors, acoustic touchscreen sensors, and/or other type of touchscreen sensors. Additionally or alternatively, the compute device 100 may include one or more peripheral devices 124. Such peripheral devices 124 may include any type of peripheral device commonly found in a compute device such as speakers, a mouse, a keyboard, and/or other input/output devices, interface devices, and/or other peripheral devices.

Figure 2:
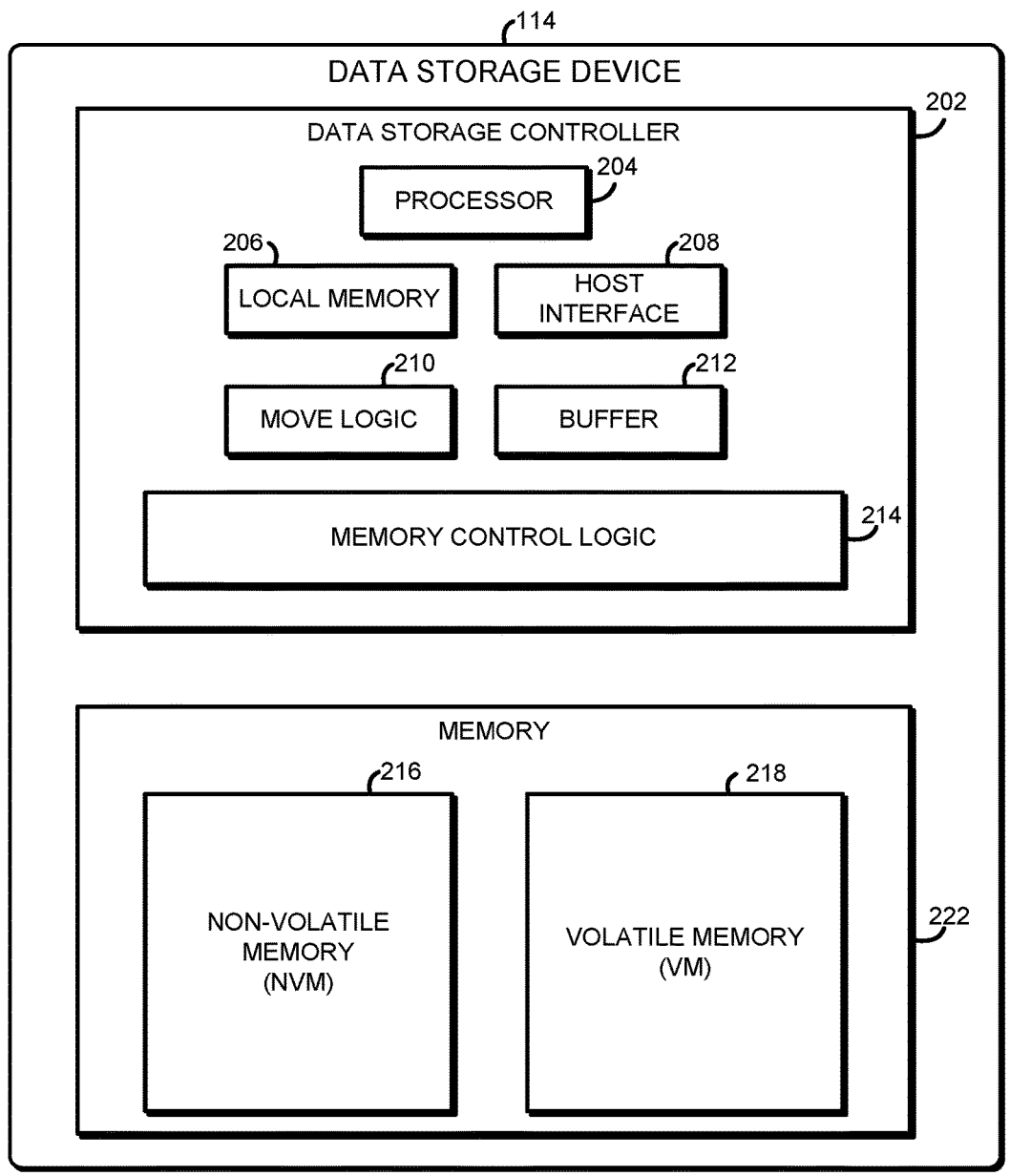
FIG. 2 is a simplified block diagram of at least one embodiment of a data storage device included in the compute device of FIG. 1.

Referring now to FIG. 2, in the illustrative embodiment, each data storage device 114 includes a data storage controller 202 and a memory 222, which illustratively includes a non-volatile memory 216 and a volatile memory 218. As discussed in more detail below, during use, the data storage controller 202 is configured to receive a move request from the host (e.g., the processor 102 of the compute device 100) to move a block of data from the data storage device 114 (e.g., the data storage device 116) to another data storage device 114 (e.g., the data storage device 118), register the move request for power loss protection, send a premature completion notification back to the host (i.e., before the move operation has been completed), read the data block from non-volatile memory, and communicate with the other data storage device 118 to move the data block to it. Similarly, if the data storage device 114 is the target of the move operation (i.e., the data storage device 114 to store the moved data block), the data storage device 114, in use, locks a logical block address and postpones any other moves or writes to that locked address, writes the data block provided by the source data storage device (e.g., the data storage device 116) to non-volatile storage, and updates the source data storage device 116 of the completion status. In the illustrative embodiment, the data storage devices 114 communicate with each other through the main memory 104 of the compute device 100 using direct memory access, without intermediation by the processor 102. By managing the move operation among themselves, the data storage devices 114 described herein free up the processor 102 to handle other tasks.

In the illustrative embodiment, the data storage controller 202 includes a processor or processing circuitry 204, local memory 206, a host interface 208, move logic 210, a buffer 212, and memory control logic (also referred to herein as a "memory controller") 214. The memory controller 214 can be in the same die or integrated circuit as the processor 204 or the memory 206, 222 or in a separate die or integrated circuit than those of the processor 204 and the memory 206, 222. In some cases, the processor 204, the memory controller 214, and the memory 206, 222 can be implemented in a single die or integrated circuit. Of course, the data storage controller 202 may include additional devices, circuits, and/or components commonly found in a drive controller of a solid state drive in other embodiments.

The processor 204 may be embodied as any type of processor capable of performing the functions described herein. For example, the processor 204 may be embodied as a single or multi-core processor(s), digital signal processor, microcontroller, or other processor or processing/controlling circuit. Similarly, the local memory 206 may be embodied as any type of volatile and/or non-volatile memory or data storage capable of performing the functions described herein. In the illustrative embodiment, the local memory 206 stores firmware and/or other instructions executable by the processor 204 to perform the described functions of the data storage controller 202. In some embodiments, the processor 204 and the local memory 206 may form a portion of a System-on-a-Chip (SoC) and be incorporated, along with other components of the data storage controller 202, onto a single integrated circuit chip.

The host interface 208 may also be embodied as any type of hardware processor, processing circuitry, input/output circuitry, and/or collection of components capable of facilitating communication of the data storage device 114 with a host device or service (e.g., a host driver or application executed by the processor 102 of the compute device 100). That is, the host interface 208 embodies or establishes an interface for accessing data stored on the data storage device 114 (e.g., stored in the memory 222). To do so, the host interface 208 may be configured to utilize any suitable communication protocol and/or technology to facilitate communications with the data storage device 114 depending on the type of data storage device. For example, the host interface 208 may be configured to communicate with a host device or service using Peripheral Component Interconnect express (PCIe), Serial Advanced Technology Attachment (SATA), Serial Attached SCSI (SAS), Universal Serial Bus (USB), and/or other communication protocol and/or technology in some embodiments.

The move logic 210 may be embodied as any device or circuitry capable of performing operations to manage a move operation as the source data storage device and/or the target data storage device, including performing the operations described above (e.g., receiving a move request from the host, registering the move request for power loss protection, sending a completion notification back to the host, communicating with the target data storage device, locking a logical block address, writing the data block provided by the source data storage device to non-volatile storage, and updating the source data storage device of the completion status, etc.). In some embodiments, the move logic 210 is incorporated into the processor 204 rather than being a discrete component.

The buffer 212 of the data storage controller 202 is embodied as volatile memory used by the data storage controller 202 to temporarily store data that is being read from or written to the memory 222. The particular size of the buffer 212 may be dependent on the total storage size of the memory 222. The memory control logic 214 is illustratively embodied as hardware circuitry and/or device configured to control the read/write access to data at particular storage locations of the memory 222.

The non-volatile memory 216 may be embodied as any type of data storage capable of storing data in a persistent manner (even if power is interrupted to the non-volatile memory 216). For example, in the illustrative embodiment, the non-volatile memory is embodied as Flash memory (e.g., NAND memory). In other embodiments, the non-volatile memory 216 may be embodied as any combination of memory devices that use chalcogenide phase change material (e.g., chalcogenide glass), three-dimensional crosspoint (3DXP) memory, or other types of byte-addressable, write-in-place non-volatile memory, ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM.

The volatile memory 218 may be embodied as any storage medium that requires power to maintain the state of data stored by the medium. Examples of volatile memory may include various types of random access memory (RAM), such as dynamic random access memory (DRAM) or static random access memory (SRAM). One particular type of DRAM that may be used is synchronous dynamic random access memory (SDRAM). In particular embodiments, the DRAM complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices 106 that implement such standards may be referred to as DDR-based interfaces.

Figure 3:
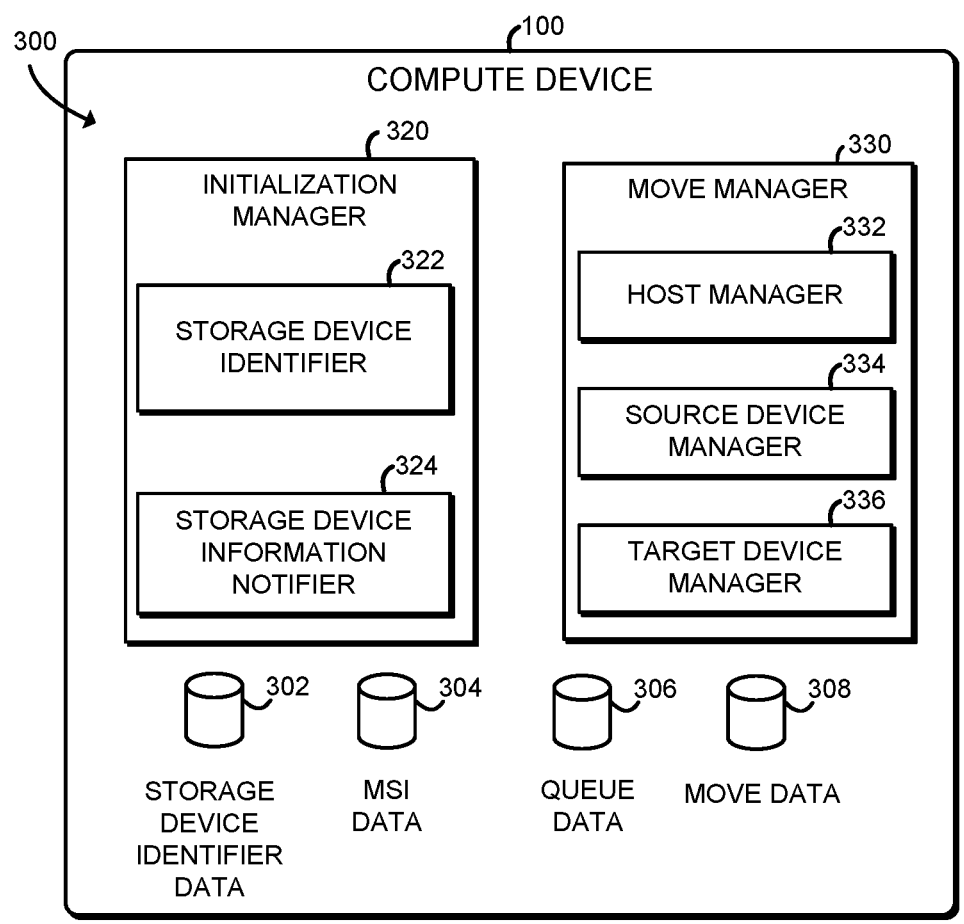
FIG. 3 is a simplified block diagram of at least one embodiment of an environment that may be established by the compute device of FIG. 1.

Referring now to FIG. 3, in use, the compute device 100 may establish an environment 300. The illustrative environment 300 includes an initialization manager 320 and a move manager 330. Each of the components of the environment 300 may be embodied as firmware, software, hardware, or a combination thereof. For example the various components and logic of the environment 300 may form a portion of, or otherwise be established by, the processor 102, the main memory 104, the I/O subsystem 110, the data storage subsystem 112 (e.g., data storage controllers 202 or other hardware components of the data storage devices 114). As such, in some embodiments, any one or more of the components of the environment 300 may be embodied as a circuit or collection of electrical devices (e.g., an initialization manager circuit 320, a move manager circuit 330, etc.). In the illustrative embodiment, the environment 300 includes storage device identifier data 302 which may be embodied as a set of identifiers that uniquely identify each data storage device 114. The environment 300 also includes MSI data 304 which may be embodied as identifications of memory regions mapped to devices, such as each of the data storage devices 114 and the processor 102, that when written to, generate an interrupt to the assigned device. Additionally, the environment 300 includes queue data 306 which may be embodied as submission queues, in which requests from devices (e.g., the processor 102, the data storage devices 114, etc.) are stored in a predefined format that includes the type of operation to be performed and associated parameters, such as a move operation, the source address, and the destination address, as well as completion queues which indicate the status (e.g., complete, incomplete) of the requests. Further, the illustrative environment 300 includes move data 308 which may be embodied as the data block or blocks that have been read by the source data storage device 116 into the main memory 104 of the compute device 100 and are to be written by the target data storage device 118 into the non-volatile memory 216.

In the illustrative embodiment, the initialization manager 320, which may be embodied as hardware, firmware, software, virtualized hardware, emulated architecture, and/or a combination thereof as discussed above, is configured to initialize the compute device 100 to a state in which the data storage devices 114 may communicate with each other to manage a move operation. To do so, in the illustrative embodiment, the initialization manager 320 includes a storage device identifier 322 and a storage device information notifier 324.

The storage device identifier 322 is configured to detect the presence of each data storage device 114 coupled to the processor 102 through the I/O subsystem 110 (e.g., through a PCIe bus) and assign a unique identifier to each data storage device 114. In the illustrative embodiment, the storage device identifier 322 does so by concatenating the serial number, the model number, and the vendor ID of each data storage device 114 to produce the unique identifier for that data storage device 114. The storage device identifier 322 may then store the unique identifiers in the storage device identifier data 302. The storage device identifier 322 is also configured to allocate portions of the main memory 104 to the detected data storage devices 114, including allocating message signaled interrupts (e.g., the MSI data 304) and request submission queues and completion queues (e.g., the queue data 306) for the data storage devices 114. The storage device information notifier 324 is configured to provide the data produced by the storage device identifier 322 to the various data storage devices 114 to enable the data storage controllers to pass requests and completion status data to each other and notify each other of the passed data.

It should be appreciated that each of the storage device identifier 322 and the storage device information notifier 324 may be separately embodied as hardware, firmware, software, virtualized hardware, emulated architecture, and/or a combination thereof. For example, the storage device identifier 322 may be embodied as a hardware component, while the storage device information notifier 324 is embodied as a virtualized hardware component or as some other combination of hardware, firmware, software, virtualized hardware, emulated architecture, and/or a combination thereof.

In the illustrative embodiment, the move manager 330, which may be embodied as hardware, firmware, software, virtualized hardware, emulated architecture, and/or a combination thereof as discussed above, is configured to initiate and manage a move operation by offloading request and completion status tracking to the data storage devices 114. To do so, in the illustrative embodiment, the move manager 330 includes a host manager 332, a source device manager 334, and a target device manager 336. In the illustrative embodiment, the host manager, which may be embodied as a driver or application executed by the processor 102 of the compute device 100, is configured to provide a request to move a block of data from a source data storage device 114 (e.g., the data storage device 116) to a target data storage device 114 (e.g., the data storage device 118). In the illustrative embodiment, the host manager 332 provides the request by writing the request, including an identification of the move operation, an identification of the source address of the data block, and an identification of the target address for the data block, to a submission queue associated with the source data storage device 116. In the illustrative embodiment, the host manager 332 then "rings the doorbell" of the source data storage device 116 by writing to the MSI allocated to the source data storage device 116, causing an interrupt to be triggered for the source data storage device 116 to check the submission queue for a new request.

The source device manager 334, which in the illustrative embodiment may be embodied as a driver of the source data storage device 116, is configured to cause the source data storage device 116 to detect that the move request has been added to the submission queue, in response to the interrupt, send a request to the target data storage device (e.g., the data storage device 118) to lock the target memory address for the move and send a premature (i.e., before the move operation has been completed) completion notification to the host (e.g., the processor 102) through a completion queue, read the data from the non-volatile memory 216 of the source data storage device 116 into the main memory 104 of the compute device 100 using direct memory access (DMA), send a request to the target data storage device 118 to move (e.g., read) the data into the non-volatile memory 216 of the target data storage device 118, and deallocate and trim (i.e., remove) the data block from the main memory 104 and from the non-volatile memory 216 of the source data storage device 116 after the data has been written to the target data storage device 118. Additionally, source device manager 334 is configured to store the move request in the non-volatile memory 216 to protect against unanticipated power interruptions and resume the move operation when power is restored.

The target device manager 336, which in the illustrative embodiment may be a driver of the target data storage device 118, is configured to lock the target address, read the data from the main memory 104 of the compute device 100 and write it to destination address in the non-volatile memory 216 of the target data storage device 118, and update the source data storage device 116 on the completion of the move operation.

It should be appreciated that each of the host manager 332, source device manager 334, and the target device manager 336 may be separately embodied as hardware, firmware, software, virtualized hardware, emulated architecture, and/or a combination thereof. For example, the host manager 332 may be embodied as a hardware component, while the source device manager 334 and the target device manager 336 are embodied as virtualized hardware components or as some other combination of hardware, firmware, software, virtualized hardware, emulated architecture, and/or a combination thereof.

Figure 4:
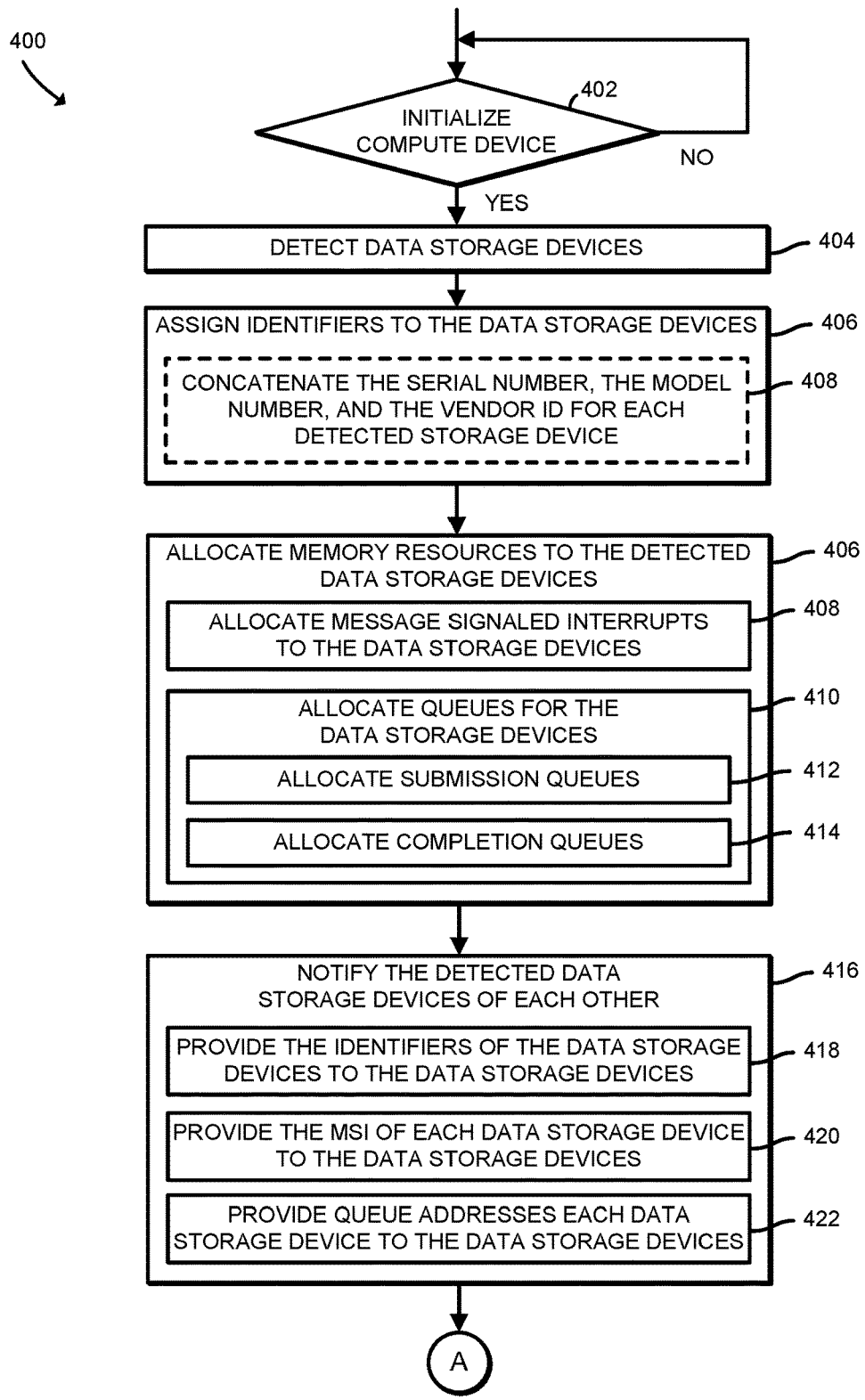
FIGS. 4 and 5 are a simplified flow diagram of at least one embodiment of a method for initializing the compute device of FIG. 1 to enable cross data storage device communication.

Referring now to FIG. 4, in use, the compute device 100 may execute a method 400 for initializing itself to enable communication between the data storage devices 114 to manage a move operation. In the illustrative embodiment, the method 400 is performed by the processor 102 executing a host driver. The method 400 begins with block 402 in which the compute device 100 determines whether to initialize itself. In the illustrative embodiment, the compute device 100 may determine to initialize itself upon receiving power or upon restarting. In other embodiments, the compute device 100 may determine to perform the initialization process in response to a request entered from a remote compute device or through a user interface to operate in a mode that provides cross data storage device communication. Regardless, in response to a determination to initialize the compute device 100, the method 400 advances to block 404 in which the compute device 100 detects the data storage devices 114. In the illustrative embodiment, the compute device 100 may do so by detecting devices connected to a bus, such as a PCIe bus, of the I/O subsystem 110. In block 406, the compute device 100 assigns identifiers to each of the detected data storage devices 114. In doing so, in the illustrative embodiment, the compute device 100 concatenates the serial number, the model number, and the vendor identifier of each data storage device, such as by polling each data storage device 114 for such information. In other embodiments, the compute device 100 assigns the identifiers using any other method that results in a unique identifier for each data storage device 114.

After assigning the identifier to the data storage devices 114, the method 400 advances to block 406 in which the compute device 100 allocates memory resources to the detected data storage devices 114. In doing so, in the illustrative embodiment, the compute device 100 allocates message signaled interrupts (MSIs) to each of the data storage devices 114, as indicated in block 408. As described above, a message signaled interrupt is a memory region (e.g., the MSI memory 106) in the main memory 104 that, when written to, generates an interrupt in a device assigned to that MSI. Additionally, in the illustrative embodiment, the compute device 100 allocates queues for the data storage devices 114, as indicated in block 410. In doing so, as indicated in block 412, the compute device 100 allocates a submission queue for each data storage device 114, in which requests submitted to the corresponding data storage device 114 are written. Further, as indicated in block 414, in allocating the queues, the compute device 100 also allocates completion queues for each data storage device 114, in which completion updates for each request are written by the corresponding data storage device 114.

Subsequently, in block 416, the compute device 100 notifies the detected data storage devices 114 of each other, as indicated in block 416. In doing so, the compute device 100 provides the identifiers of the data storage devices 114 to all of the data storage devices 114, as indicated in block 418. Additionally, in the illustrative embodiment, the compute device 100 provides the MSI of each data storage device 114 to all of the data storage devices 114, as indicated in block 420. Further, as indicated in block 422, the compute device 100 provides the memory addresses of the submission and completion queues allocated to the data storage devices 114 to all of the data storage devices 114. Accordingly, any given data storage device 114 may send data (e.g., a request or completion status update) to any other data storage device 114 and notify the recipient data storage device 114 of the sent data by writing to the corresponding MSI.

Figure 5:
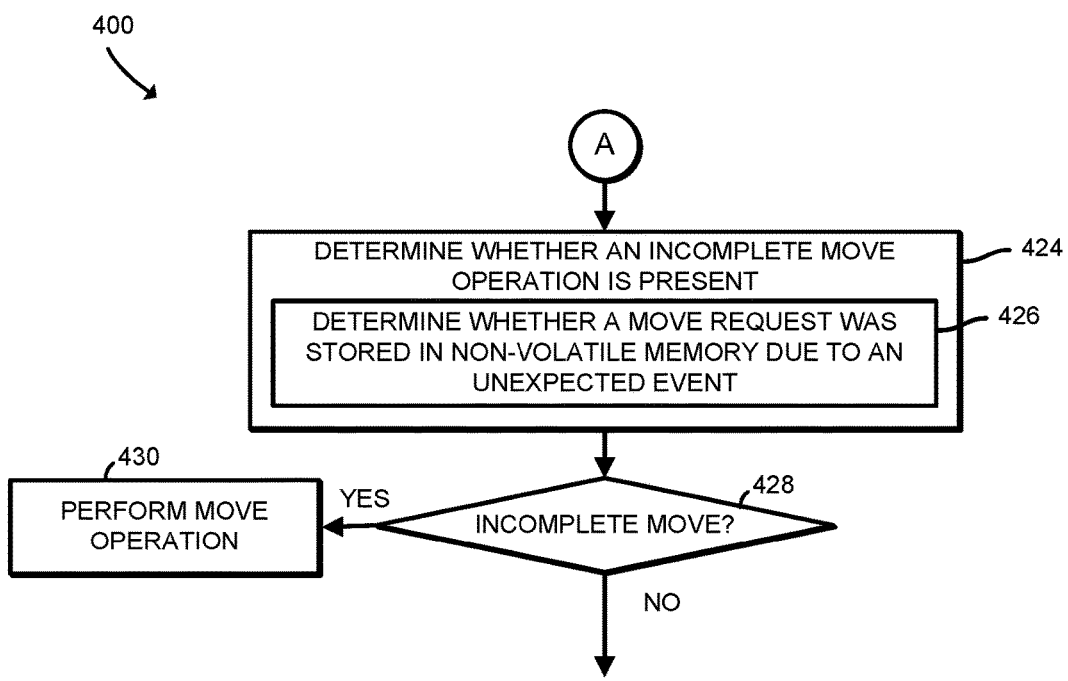

Referring now to FIG. 5, after the compute device 100 has notified the detected data storage devices 114 of each other, the method 400 advances to block 424 in which the compute device 100 determines whether an incomplete move operation is present. In doing so, as indicated in block 426, the compute device 100 may determine whether a move request was stored in the non-volatile memory of one of the detected data storage devices 114 (e.g., the source data storage device 116) due to an unexpected event (e.g., a power interruption). For example, the data storage devices 114 may include capacitor-back energy to store small amounts of state information on a power loss. As described above, each data storage device 114 is configured to store a move request received from the host (e.g., the processor 102) into power loss protected memory (e.g., the non-volatile memory 216) to enable the compute device 100 to resume a move operation upon receiving power again, without relying on the processor 102 to journal the state of a move operation.

In block 428, the compute device 100 determines the next operations to perform based on whether an incomplete move operation was detected in block 424. If an incomplete move operation was detected, the method 400 advances to block 430 in which the compute device 100 performs (i.e., continues) the move operation. Otherwise, the compute device 100 continues normal operation.

Figure 6:
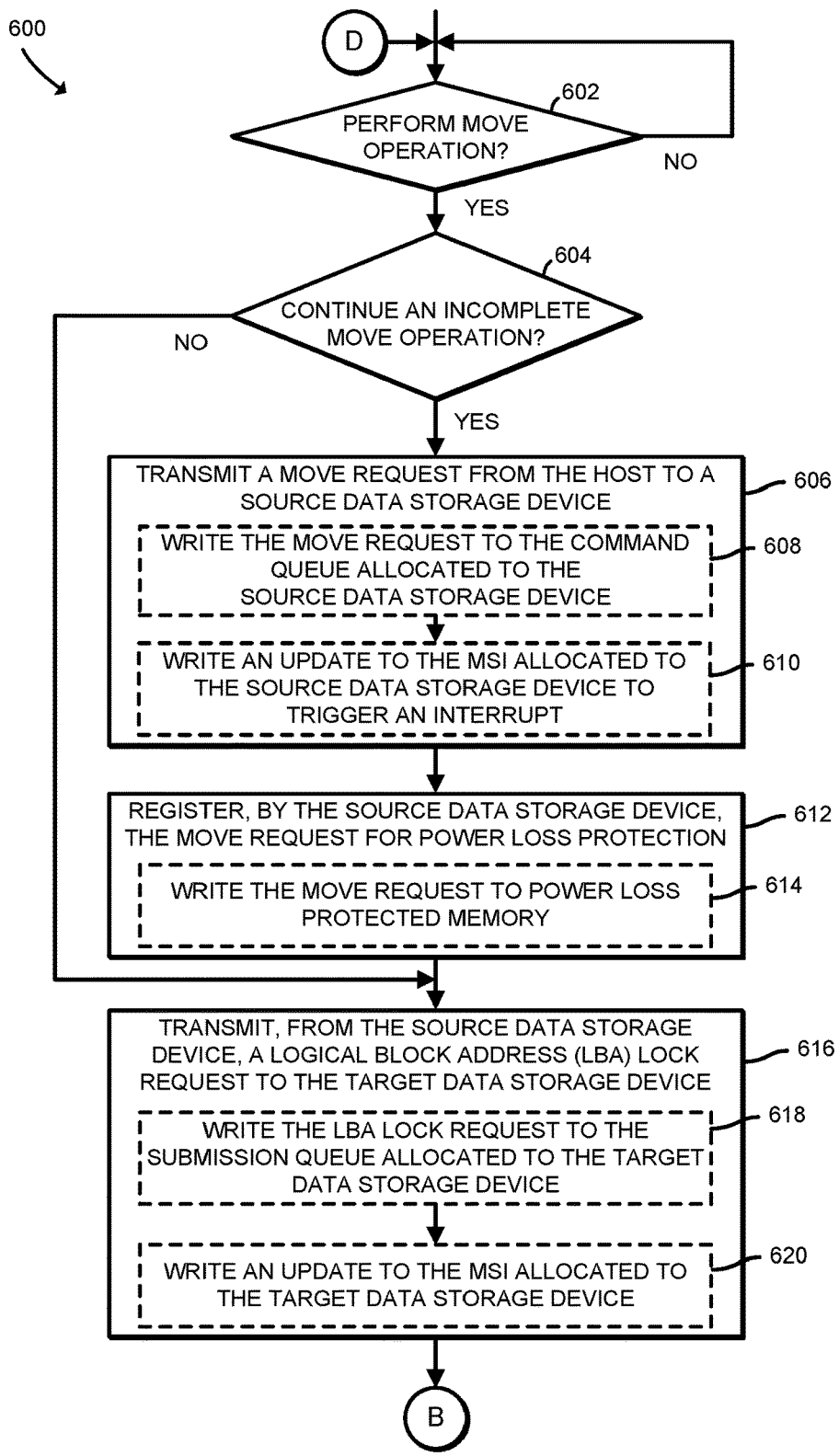
FIGS. 6-8 are a simplified flow diagram of at least one embodiment of a method for moving data from one data storage device to another data storage device using cross data storage device communication that may be executed by the compute device of FIG. 1.

Referring now to FIG. 6, in use, the compute device 100 may execute a method 600 for moving data from one data storage device 114 (e.g., the source data storage device 116) to another data storage device 114 (e.g., the target data storage device 118) using cross data storage device communication. The method 600 begins with block 602 in which the compute device 100 determines whether to perform a move operation. In the illustrative embodiment, the compute device 100 may determine to perform a move operation in response to a request to do so from another compute device (not shown), through a request provided through a user interface (not shown), upon detection of an existing move operation that was not completed, as described above with reference to the method 400, or based on other factors. Regardless, if the compute device 100 determines to perform a move operation, the method 600 advances to block 604 in which the compute device 100 determines whether to continue an incomplete move operation. As described above, with reference to the method 400, the compute device 100 may determine to continue an incomplete move operation in response to detecting the existence of a move operation that was stored in the non-volatile memory of the source data storage device 116 and not trimmed (i.e., not removed) upon completion of the move (e.g., because power was interrupted before the move operation completed). If the compute device 100 determines to continue an incomplete move operation, the method advances to block 616, in which the compute device 100 transmits, from the source data storage device 116, a logical block address (LBA) lock request to the target data storage device 118, as described in more detail below. However, if the compute device 100 instead determines not to continue an incomplete move operation (e.g., the compute device 100 did not detect a move request in the non-volatile memory of the source data storage device 116), the method 600 advances to block 616, in which the compute device 100 transmits a move request from the host (e.g., the processor 102) to the source data storage device 116. In doing so, in the illustrative embodiment, the compute device 100 writes the move request to the command queue allocated to the source data storage device 116, as indicated in block 608. Additionally, in the illustrative embodiment, the compute device 100 writes an update to the MSI allocated to the source data storage device 116 to trigger an interrupt to cause the source data storage device 116 to detect the move request in the submission queue, as indicated in block 610.

Subsequently, in block 612, the compute device 100, and in particular, the source data storage device 116, registers the move request for power loss protection. In doing so, in the illustrative embodiment, the compute device 100 writes the move request to power loss protected memory (e.g., the non-volatile memory 216), as indicated in block 614. As a result, if power is interrupted to the compute device 100, the move request will remain in the memory 218 and the compute device 100 may detect the request upon re-initialization (e.g., execution of the method 400).

After registering the move request for power loss protection, or in response to a determination to continue an incomplete move operation, the compute device 100 transmits, from the source data storage device 116, a logical block address (LBA) lock request to the target data storage device 118, as indicated in block 616. As discussed above, the logical block address is defined as a parameter of the move request sent by the host (e.g., the processor 102) to the source data storage device 116 in block 606. In the illustrative embodiment, in transmitting the LBA lock request to the target data storage device 118, the source data storage device 116 writes the LBA lock request to the submission queue allocated to the target data storage device 118, as indicated in block 618, and writes an update to the MSI allocated to the target data storage device 118, as indicated in block 620. As described above, writing to an MSI allocated to a given device triggers an interrupt, causing that device to check its queues for new items.

Figure 7:
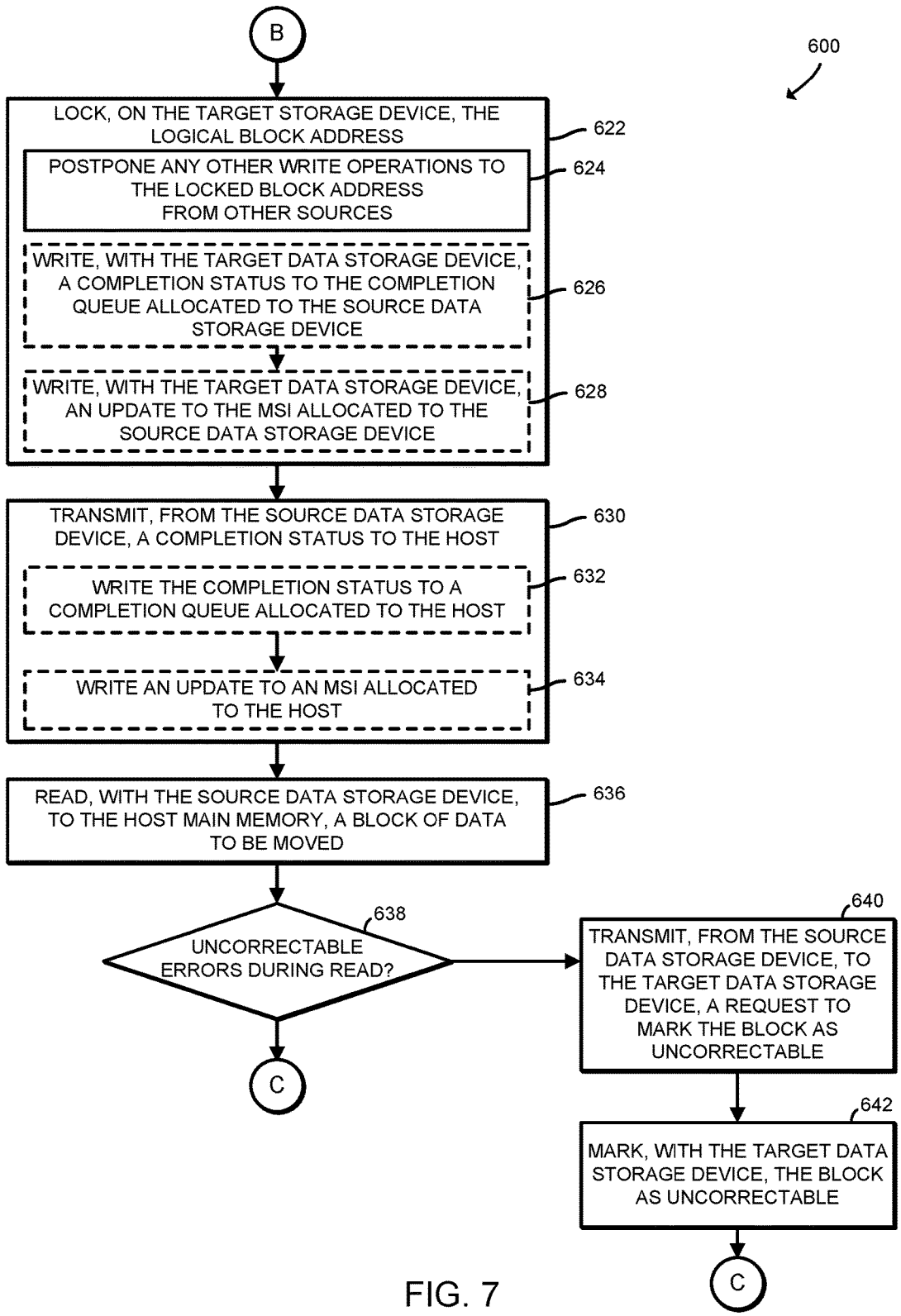

Referring now to FIG. 7, after the source data storage device 116 has transmitted the LBA lock request to the target data storage device 118, the method 600 advances to block 622, in which the compute device 100, and more particularly, the target data storage device 118, locks the logical block address. In doing so, in the illustrative embodiment, the target data storage device 118 postpones any other write operations to the locked block address that may have originated from other sources (e.g., from an application executed by the processor 102). Additionally, in the illustrative embodiment, after locking the logical block address, the target data storage device 118 writes a completion status to the completion queue allocated to the source data storage device 116, indicating that the LBA lock request has been completed, as indicated in block 626. Further, in the illustrative embodiment, to notify the source data storage device 116 of the completion status, the target data storage device 118 writes an update to the MSI allocated to the source data storage device, thereby causing an interrupt that prompts the source data storage device 116 to check the completion queue for the update, as indicated in block 628.

After locking the logical block address, the compute device 100, and more specifically, the source data storage device 116, transmits a completion status to the host (e.g., the processor 102), as indicated in block 630. In doing so, in the illustrative embodiment, the source data storage device 116 writes the completion status to a completion queue allocated to the host (e.g., the processor 102), as indicated in block 632, and writes an update to an MSI allocated to the host (e.g., the processor 102) to cause the processor 102 to check the completion queue and determine that the move request has been completed. As a result, the remainder of the move operation is offloaded from the host (e.g., the processor 102) to the data storage devices 114. In block 636, after transmitting the completion status to the host, the source data storage device 116 reads, from the non-volatile memory 216 to the main memory 104 of the compute device 100, the block of data to be moved, per the move request originally sent from the host. In the illustrative embodiment, the source data storage device 116 reads the data block into the main memory 104 using direct memory access (DMA).

In block 638, the compute device 100 determines whether uncorrectable errors were detected during the read performed in block 638. An uncorrectable error may be present when the number of corrupted bits in a particular block of data exceeds the error correction capabilities of any error correction code (ECC) logic included in the source data storage device 116. If uncorrectable errors are present, the method 600 advances to block 640, in which the compute device 100, and more specifically the source data storage device 116, transmits to the target data storage device 118 a request to mark the block as uncorrectable. In response, the target data storage device 118 marks the block, at the locked logical block address, as uncorrectable, as indicated in block 642.

Figure 8:
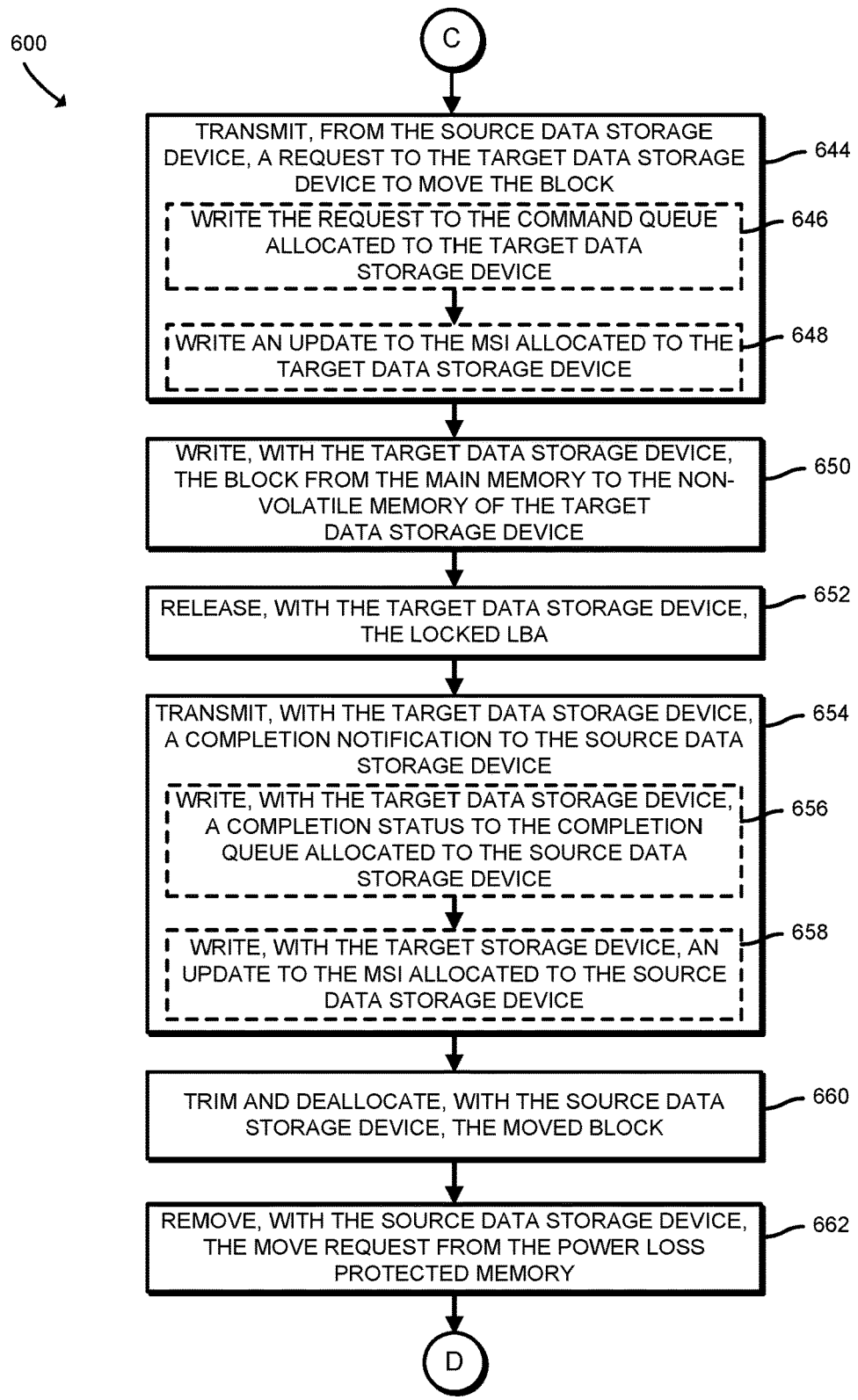

Referring now to FIG. 8, after marking the block as uncorrectable, or if the compute device 100 did not detect uncorrectable errors in block 638, the method 600 advances to block 644, in which the compute device 100, and more specifically the source data storage device 116, transmits a request to the target data storage device 118 to move the block. In doing so, in the illustrative embodiment, the source data storage device 116 writes the request to the submission queue allocated to the target data storage device 118, as indicated in block 646, and writes an update to the MSI allocated to the target data storage device 118, as indicated in block 648. Subsequently, in block 650, the target data storage device 118 writes the block from the main memory 104 to the non-volatile memory 216 of the target data storage device 118. In other embodiments, if the compute device 100 determined that the block contains uncorrectable errors, the method 600 may skip blocks 644 and 650 and proceed directly to block 652. In the illustrative embodiment, however, the target data storage device 118 writes the data block regardless of whether it contains uncorrectable errors, but retains the indication that the block has uncorrectable errors if such errors were detected, as described in blocks 638 through 642. Regardless, the method 600 subsequently advances to block 652 in which the target data storage device 118 releases the locked logical block address.

After the logical block address has been unlocked in block 652, the method 600 advances to block 654, in which the target data storage device 118 transmits a completion notification to the source data storage device 116. In doing so, in the illustrative embodiment, the target data storage device 118 writes a completion status to the completion queue allocated to the source data storage device 116, as indicated in block 656. Subsequently, in the illustrative embodiment, the target data storage device 118 writes an update to the MSI allocated to the source data storage device 116 to trigger an interrupt that causes the source data storage device 116 to check the completion queue, as indicated in block 658.

After the target data storage device 118 has transmitted the completion notification to the source data storage device 116, the method 600 advances to block 660 in which the source data storage device 116 trims the moved block of data from the non-volatile memory 216 of the source data storage device 116 and deallocates the block from the main memory 104. Subsequently, the source data storage device 116 removes (e.g., trims) the move request from the power loss protected memory (e.g., the non-volatile memory 216). Afterwards, the method 600 returns to block 602 of FIG. 6 to determine whether to perform another move operation.

Figure 9:
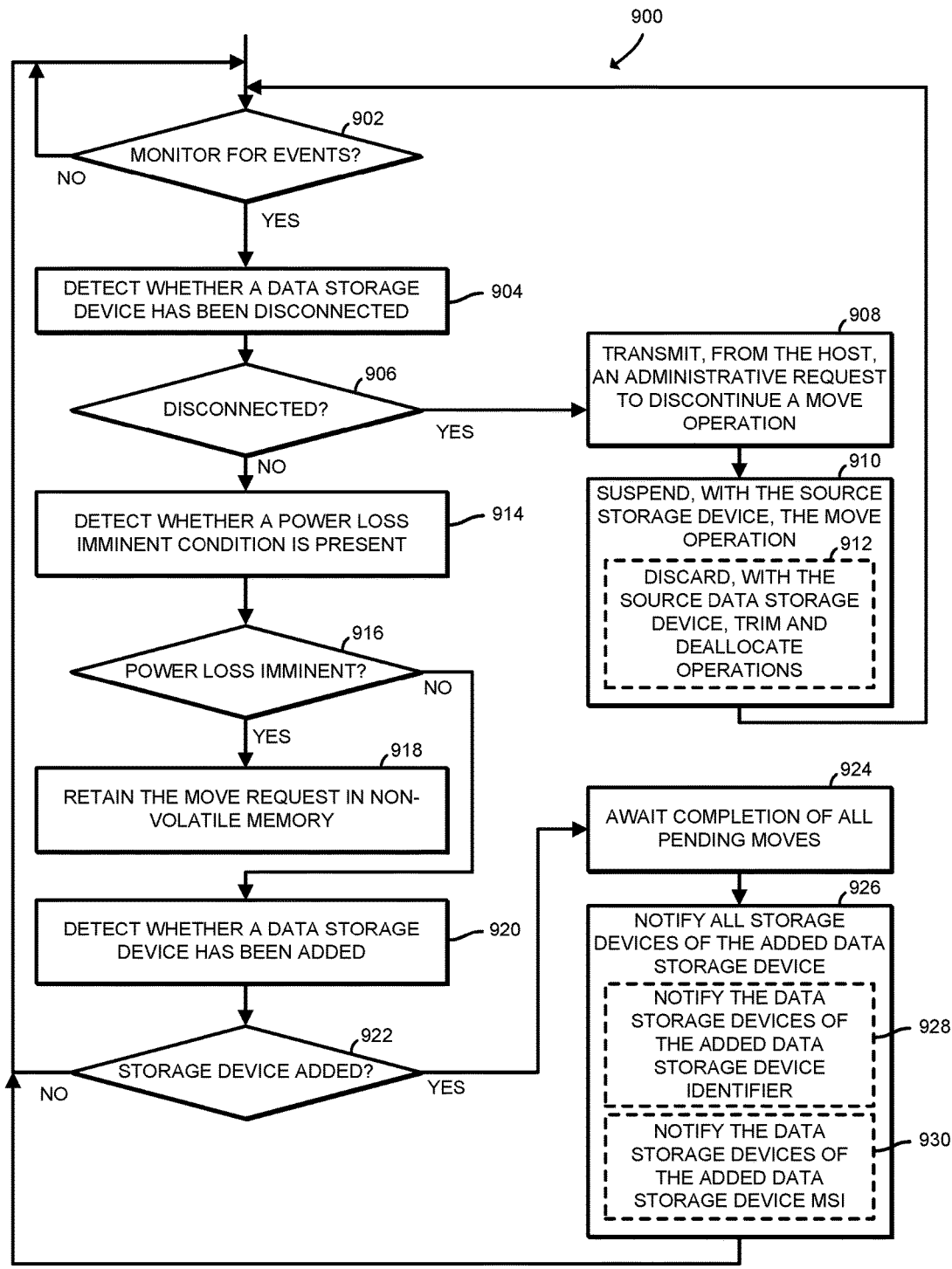
FIG. 9 is a simplified diagram of at least one embodiment of a method for managing unexpected system events that may be executed by the compute device of FIG. 1.

Referring now to FIG. 9, in operation, the compute device 100 may execute a method 900 for managing unexpected system events. In the illustrative embodiment, the compute device 100 continually performs the method 900 in parallel with any other operations performed by the compute device 100. The method 900 begins with block 902 in which the compute device 100 determines whether to monitor for events. In the illustrative embodiment, the compute device 100 determines to monitor for events as long as the compute device is receiving power. In other embodiments, the determination of whether to monitor for events may be based on other factors. Regardless, in response to a determination to monitor for events, the method 900 advances to block 904 in which the compute device 100 detects whether one of the data storage devices 114 has become disconnected from the compute device 100. The compute device 100 may detect that the data storage device 114 has become disconnected based on a failure of the data storage device 114 to respond to a query within a predefined time period, based on detecting that the data storage device 114 is no longer drawing power from the compute device 100, and/or based on other factors. In block 906, the compute device 100 determines a course of action based on whether the compute device 100 has detected that the data storage device 114 has been disconnected. If the data storage device 114 (e.g., the target data storage device 118) is disconnected, the method 900 advances to block 908 in which the compute device 100 transmits, from the host (e.g., the processor 102), an administrative request to the connected data storage devices 114 (e.g., the source data storage device 116) to discontinue any pending move operations. Subsequently, the connected data storage devices 114 (e.g., the source data storage device 116) suspends a pending move operation, as indicated in block 910. In doing so, in the illustrative embodiment, the source data storage device 116 discards the trim and deallocation operations that are normally performed at the completion of a move operation (e.g. blocks 660 and 662), as indicated in block 912. The method 900 then returns back to block 902 to continue monitoring for events.

Referring back to block 906, if the compute device 100 instead determines that a data storage device 114 has not been disconnected, the method 900 advances to block 914, in which the compute device 100 detects whether a power loss imminent condition is present. The compute device 100 may detect a power loss imminent condition by monitoring for changes in the power supplied to the compute device 100, by monitoring whether capacitors in the compute device 100 have begun discharging, and/or based on other factors. In block 916, the compute device 100 determines a course of action based on whether a power loss imminent condition has been detected. If a power loss imminent condition is detected, the method 900 advances to block 918 in which the compute device 100 retains any move requests in the non-volatile memory 216 of the source data storage device 116 (e.g., the power loss protected memory). Subsequently, power is lost, so the compute device 100 may not perform additional steps until power is restored, in which case the compute device 100 may perform the initialization method 400 described with reference to FIGS. 4 and 5.

Referring back to block 916, if a power loss imminent condition is not detected, the method 900 advances to block 920, in which the compute device detects whether a data storage device 114 has been added. The compute device 100 may detect that a data storage device has been added based on a message transmitted from the added data storage device 114 to the processor through the I/O subsystem 110 and/or based on other factors. In block 922, the compute device 100 determines a course of action to take based on whether the compute device 100 determined that a data storage device 114 has been added. If so, the method 900 advances to block 924 in which the compute device 100 awaits completion of all pending move operations. Subsequently, in block 926, the compute device 100 notifies all of the data storage devices 114 of the added data storage device 114. In doing so, in the illustrative embodiment, the compute device 100 notifies the data storage devices 114 of an identifier assigned to the added data storage device 114, as indicated in block 928. Additionally, in the illustrative embodiment, the compute device 100 notifies the data storage devices 114 of the MSI of the added data storage device 114, as indicated in block 930. Subsequently, or if the compute device 100 determined that a data storage device 114 has not been added, the method 900 returns to block 902 in which the compute device 100 determines whether to continue monitoring for events. While the detections in blocks 904, 914, and 920 are shown in a particular order, it should be understood that, in other embodiments, these detections may be performed in a different order or concurrently.

Reference to memory devices above can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device.

EXAMPLES

Illustrative examples of the technologies disclosed herein are provided below. An embodiment of the technologies may include any one or more, and any combination of, the examples described below.

Example 1 includes a data storage subsystem for providing cross data storage device communication for a move operation, the data storage subsystem comprising a first data storage device including a first non-volatile memory; and a second data storage device including a second non-volatile memory; wherein the first data storage device is to transmit, in response to a move request that identifies a block of data to be moved from the first data storage device to the second data storage device, a completion notification to a processor; read, after transmitting the completion notification, the block of data from the first non-volatile memory to a volatile memory; and transmit, to the second data storage device, a second move request to move the block of data; and the second data storage device is to write, in response to the second move request, the block of data from the volatile memory to the second non-volatile memory of the second data storage device.

Example 2 includes the subject matter of Example 1, and wherein the first data storage device is further to remove, from the first non-volatile memory, the block after the block has been written to the second non-volatile memory of the second data storage device.

Example 3 includes the subject matter of any of Examples 1 and 2, and wherein the first data storage device is further to deallocate, from the volatile memory, the block after the block has been written to the second non-volatile memory of the second data storage device.

Example 4 includes the subject matter of any of Examples 1-3, and wherein the first data storage device is further to transmit, in response to the first move request, a lock request to provide exclusive access to a logical address of the block to the second data storage device; and the second data storage device is further to lock, in response to the lock request, the logical address in the second non-volatile memory.

Example 5 includes the subject matter of any of Examples 1-4, and wherein the second data storage device is further to unlock the logical address after the block has been written to the second non-volatile memory.

Example 6 includes the subject matter of any of Examples 1-5 and wherein to transmit the lock request comprises to write the lock request to a command queue allocated to the second data storage device; and write an update to a message signaled interrupt (MSI) allocated to the second data storage device to trigger an interrupt.

Example 7 includes the subject matter of any of Examples 1-6, and wherein the first data storage device is further to write the move request to the first non-volatile memory prior to a power loss condition; detect the move request in the first non-volatile memory after the power loss condition has occurred; and resume, in response to the detection of the move request in the first non-volatile memory, the move of the block.

Example 8 includes the subject matter of any of Examples 1-7, and wherein the first data storage device is further to register, after receipt of the first move request, the first move request for power loss protection.

Example 9 includes the subject matter of any of Examples 1-8, and wherein to transmit the second move request comprises to write the second move request to a command queue allocated to the second data storage device; and write an update to a message signaled interrupt (MSI) allocated to the second data storage device to trigger an interrupt.

Example 10 includes the subject matter of any of Examples 1-9, and wherein the first data storage device is further to determine whether an uncorrectable error occurred during the read of the block; and transmit, in response to a determination that an uncorrectable error occurred, a request to the second data storage device to mark the block as uncorrectable; and the second data storage device is further to mark the block as uncorrectable in response to the request.

Example 11 includes the subject matter of any of Examples 1-10, and wherein the first non-volatile memory and the second non-volatile memory are NAND memory.

Example 12 includes the subject matter of any of Examples 1-11, and a method for providing cross data storage device communication for a move operation, the method comprising transmitting, by a first data storage device and in response to a move request that identifies a block of data to be moved from the first data storage device to the second data storage device, a completion notification to a processor; reading, by the first data storage device and after transmitting the completion notification, the block of data from a first non-volatile memory of the first data storage device to a volatile memory; transmitting, by the first data storage device to the second data storage device, a second move request to move the block of data; and writing, by the second data storage device and in response to the second move request, the block of data from the volatile memory to a second non-volatile memory of the second data storage device.

Example 13 includes the subject matter of any of Examples 1-12, and further including removing, by the first data storage device, from the first non-volatile memory, the block after the block has been written to the second non-volatile memory of the second data storage device.

Example 14 includes the subject matter of any of Examples 1-13, and further including deallocating, by the first data storage device, from the volatile memory, the block after the block has been written to the second non-volatile memory of the second data storage device.

Example 15 includes the subject matter of any of Examples 1-14, and further including transmitting, by the first data storage device and in response to the first move request from the processor, a lock request to provide exclusive access to a logical address of the block to the second data storage device; and locking, by the second data storage device and in response to the lock request, the logical address in the second non-volatile memory.

Example 16 includes the subject matter of any of Examples 1-15, and further including unlocking, by the second data storage device, the logical address after the block has been written to the second non-volatile memory.

Example 17 includes the subject matter of any of Examples 1-16, and wherein transmitting the lock request comprises writing the lock request to a command queue allocated to the second data storage device; and writing an update to a message signaled interrupt (MSI) allocated to the second data storage device to trigger an interrupt.

Example 18 includes the subject matter of any of Examples 1-17, and further including writing, by the first data storage device, the move request to the first non-volatile memory prior to a power loss condition; detecting, by the first data storage device, the move request in the first non-volatile memory after the power loss condition has occurred; and resuming, by the first data storage device and in response to the detection of the move request in the first non-volatile memory, the move of the block.

Example 19 includes the subject matter of any of Examples 1-18, and further including registering, by the first data storage device and after receipt of the first move request, the first move request for power loss protection.

Example 20 includes the subject matter of any of Examples 1-19, and wherein transmitting the second move request comprises writing the second move request to a command queue allocated to the second data storage device; and writing an update to a message signaled interrupt (MSI) allocated to the second data storage device to trigger an interrupt.

Example 21 includes the subject matter of any of Examples 1-20, and further including determining, by the first data storage device, whether an uncorrectable error occurred during the read of the block; and transmitting, by the first data storage device and in response to a determination that an uncorrectable error occurred, a request to the second data storage device to mark the block as uncorrectable; and marking, by the second data storage device, the block as uncorrectable in response to the request.

Example 22 includes one or more computer-readable storage media comprising a plurality of instructions that, when executed by a data storage subsystem, cause the data storage subsystem to perform the method of any of Examples 12-21.

Example 23 includes the subject matter of Example 22, and a data storage subsystem comprising means for transmitting, with a first data storage device and in response to a move request that identifies a block of data to be moved from the first data storage device to the second data storage device, a completion notification to a processor; means for reading, with the first data storage device and after transmitting the completion notification, the block of data from a first non-volatile memory of the first data storage device to a volatile memory; means for transmitting, with the first data storage device to the second data storage device, a second move request to move the block of data; and means for writing, with the second data storage device and in response to the second move request, the block of data from the volatile memory to a second non-volatile memory of the second data storage device.

Example 24 includes the subject matter of any of Examples 22 and 23, and further including means for removing, with the first data storage device, from the first non-volatile memory, the block after the block has been written to the second non-volatile memory of the second data storage device.

Example 25 includes the subject matter of any of Examples 22-24, and further including means for deallocating, with the first data storage device, from the volatile memory, the block after the block has been written to the second non-volatile memory of the second data storage device.

Example 26 includes the subject matter of any of Examples 22-25, and further including means for transmitting, with the first data storage device and in response to the first move request from the processor, a lock request to provide exclusive access to a logical address of the block to the second data storage device; and means for locking, with the second data storage device and in response to the lock request, the logical address in the second non-volatile memory.

Example 27 includes the subject matter of any of Examples 22-26, and The data storage subsystem of Example 26, further including means for unlocking, with the second data storage device, the logical address after the block has been written to the second non-volatile memory.

Example 28 includes the subject matter of any of Examples 22-27, and wherein the means for transmitting the lock request comprises means for writing the lock request to a command queue allocated to the second data storage device; and means for writing an update to a message signaled interrupt (MSI) allocated to the second data storage device to trigger an interrupt.

Example 29 includes the subject matter of any of Examples 22-28, and further including means for writing, with the first data storage device, the move request to the first non-volatile memory prior to a power loss condition; means for detecting, with the first data storage device, the move request in the first non-volatile memory after the power loss condition has occurred; and means for resuming, with the first data storage device and in response to the detection of the move request in the first non-volatile memory, the move of the block.

Example 30 includes the subject matter of any of Examples 22-29, and further including means for registering, with the first data storage device and after receipt of the first move request, the first move request for power loss protection.

Example 31 includes the subject matter of any of Examples 22-30, and wherein the means for transmitting the second move request comprises means for writing the second move request to a command queue allocated to the second data storage device; and means for writing an update to a message signaled interrupt (MSI) allocated to the second data storage device to trigger an interrupt.

Example 32 includes the subject matter of any of Examples 22-31, and further including means for determining, with the first data storage device, whether an uncorrectable error occurred during the read of the block; and means for transmitting, with the first data storage device and in response to a determination that an uncorrectable error occurred, a request to the second data storage device to mark the block as uncorrectable; and means for marking, with the second data storage device, the block as uncorrectable in response to the request.

Example 33 includes a compute device for providing cross data storage device communication for a move operation, the compute device comprising a processor; a volatile memory coupled to the processor; a first data storage device including a first non-volatile memory; and a second data storage device including a second non-volatile memory; wherein the processor is to transmit a move request to the first data storage device, wherein the move request identifies a block of data to be moved from the first data storage device to the second data storage device; the first data storage device is to transmit, in response to the move request, a completion notification to the processor; read, after transmitting the completion notification, the block of data from the first non-volatile memory to the volatile memory; and transmit, to the second data storage device, a second move request to move the block of data; and the second data storage device is to write, in response to the second move request, the block of data from the volatile memory to the second non-volatile memory of the second data storage device.

Example 34 includes the subject matter of Example 33, and wherein the first data storage device is further to remove, from the first non-volatile memory, the block after the block has been written to the second non-volatile memory of the second data storage device.

Example 35 includes the subject matter of any of Examples 33 and 34, and wherein the first data storage device is further to deallocate, from the volatile memory, the block after the block has been written to the second non-volatile memory of the second data storage device.

Example 36 includes the subject matter of any of Examples 33-35, and wherein the first data storage device is further to transmit, in response to the first move request from the processor, a lock request to provide exclusive access to a logical address of the block to the second data storage device; and the second data storage device is further to lock, in response to the lock request, the logical address in the second non-volatile memory.

Example 37 includes the subject matter of any of Examples 33-36, and wherein the second data storage device is further to unlock the logical address after the block has been written to the second non-volatile memory.

Example 38 includes the subject matter of any of Examples 33-37, and wherein to transmit the lock request comprises to write the lock request to a command queue allocated to the second data storage device; and write an update to a message signaled interrupt (MSI) allocated to the second data storage device to trigger an interrupt.

Example 39 includes the subject matter of any of Examples 33-38, and wherein the first data storage device is further to write the move request to the first non-volatile memory prior to a power loss condition; detect the move request in the first non-volatile memory after the power loss condition has occurred; and resume, in response to the detection of the move request in the first non-volatile memory, the move of the block.

Example 40 includes the subject matter of any of Examples 33-39, and wherein the processor is further to detect the first data storage device and the second data storage device; assign identifiers to each of the first data storage device and the second data storage device; allocate memory resources to the first data storage device and the second data storage device; and notify the first data storage device and the second data storage device of each other.

Example 41 includes the subject matter of any of Examples 33-40, and wherein to assign identifiers to each of the first data storage device and the second data storage device comprises to concatenate a serial number, a model number, and a vendor identifier for each of the first data storage device and the second data storage device.

Example 42 includes the subject matter of any of Examples 33-41, and wherein to allocate the memory resources comprises to allocate a message signaled interrupt (MSI) for each storage device; and allocate a request submission queue and a request completion queue for each storage device.

Example 43 includes the subject matter of any of Examples 33-42, and wherein to notify the first data storage device and the second data storage device of each other comprises to provide the identifiers and the MSIs of the storage devices to the storage devices.

Example 44 includes the subject matter of any of Examples 33-43, and wherein to transmit the first move request comprises to write the move request to a command queue allocated to the first data storage device; and write an update to a message signaled interrupt (MSI) allocated to the first data storage device to trigger an interrupt.

Example 45 includes the subject matter of any of Examples 33-44, and wherein the first data storage device is further to register, after receipt of the first move request, the first move request for power loss protection.

Example 46 includes the subject matter of any of Examples 33-45, and wherein to transmit the second move request comprises to write the second move request to a command queue allocated to the second data storage device; and write an update to a message signaled interrupt (MSI) allocated to the second data storage device to trigger an interrupt.

Example 47 includes the subject matter of any of Examples 33-46, and wherein the first data storage device is further to determine whether an uncorrectable error occurred during the read of the block; and transmit, in response to a determination that an uncorrectable error occurred, a request to the second data storage device to mark the block as uncorrectable; and the second data storage device is further to mark the block as uncorrectable in response to the request.

Example 48 includes the subject matter of any of Examples 33-47, and wherein the processor is further to determine whether the second data storage device has been disconnected; and transmit, in response to a determination that the second data storage device has been disconnected, an administrative request to the first data storage device to discontinue the move operation; and the first data storage device is further to suspend, in response to the administrative request, the move operation.

Example 49 includes the subject matter of any of Examples 33-48, and wherein the processor is further to determine whether a storage device has been added; await, in response to a determination that a storage device has been added, completion of the move operation; and notify, in response to completion of the move operation, the storage devices of the added storage device.

Example 50 includes the subject matter of any of Examples 33-49, and The compute device of Example 33, wherein the first non-volatile memory and the second non-volatile memory are NAND memory.

Example 51 includes a method for providing cross data storage device communication for a move operation, the method comprising transmitting, by a processor of a compute device, a move request to a first data storage device of the compute device, wherein the move request identifies a block of data to be moved from the first data storage device to a second data storage device of the compute device; transmitting, by the first data storage device and in response to the move request, a completion notification to the processor; reading, by the first data storage device and after transmitting the completion notification, the block of data from a first non-volatile memory of the first data storage device to a volatile memory of the compute device; transmitting, by the first data storage device to the second data storage device, a second move request to move the block of data; and writing, by the second data storage device and in response to the second move request, the block of data from the volatile memory to a second non-volatile memory of the second data storage device.

Example 52 includes the subject matter of Example 51, and further including removing, by the first data storage device, from the first non-volatile memory, the block after the block has been written to the second non-volatile memory of the second data storage device.

Example 53 includes the subject matter of any of Examples 51 and 52, and further including deallocating, by the first data storage device, from the volatile memory, the block after the block has been written to the second non-volatile memory of the second data storage device.

Example 54 includes the subject matter of any of Examples 51-53, and further including transmitting, by the first data storage device and in response to the first move request from the processor, a lock request to provide exclusive access to a logical address of the block to the second data storage device; and locking, by the second data storage device and in response to the lock request, the logical address in the second non-volatile memory.

Example 55 includes the subject matter of any of Examples 51-54, and further including unlocking, by the second data storage device, the logical address after the block has been written to the second non-volatile memory.

Example 56 includes the subject matter of any of Examples 51-55, and wherein transmitting the lock request comprises writing the lock request to a command queue allocated to the second data storage device; and writing an update to a message signaled interrupt (MSI) allocated to the second data storage device to trigger an interrupt.

Example 57 includes the subject matter of any of Examples 51-56, and further including writing, by the first data storage device, the move request to the first non-volatile memory prior to a power loss condition; detecting, by the first data storage device, the move request in the first non-volatile memory after the power loss condition has occurred; and resuming, by the first data storage device and in response to the detection of the move request in the first non-volatile memory, the move of the block.

Example 58 includes the subject matter of any of Examples 51-57, and further including detecting, by the processor, the first data storage device and the second data storage device; assigning, by the processor, identifiers to each of the first data storage device and the second data storage device; allocating, by the processor, memory resources to the first data storage device and the second data storage device; and notifying, by the processor, the first data storage device and the second data storage device of each other.

Example 59 includes the subject matter of any of Examples 51-58, and wherein assigning identifiers to each of the first data storage device and the second data storage device comprises concatenating a serial number, a model number, and a vendor identifier for each of the first data storage device and the second data storage device.

Example 60 includes the subject matter of any of Examples 51-59, and wherein allocating the memory resources comprises allocating a message signaled interrupt (MSI) for each storage device; and allocating a request submission queue and a request completion queue for each storage device.

Example 61 includes the subject matter of any of Examples 51-60, and wherein notifying the first data storage device and the second data storage device of each other comprises providing the identifiers and the MSIs of the storage devices to the storage devices.

Example 62 includes the subject matter of any of Examples 51-61, and wherein transmitting the first move request comprises writing the move request to a command queue allocated to the first data storage device; and writing an update to a message signaled interrupt (MSI) allocated to the first data storage device to trigger an interrupt.

Example 63 includes the subject matter of any of Examples 51-62, and further including registering, by the first data storage device and after receipt of the first move request, the first move request for power loss protection.

Example 64 includes the subject matter of any of Examples 51-63, and wherein transmitting the second move request comprises writing the second move request to a command queue allocated to the second data storage device; and writing an update to a message signaled interrupt (MSI) allocated to the second data storage device to trigger an interrupt.

Example 65 includes the subject matter of any of Examples 51-64, and further including determining, by the first data storage device, whether an uncorrectable error occurred during the read of the block; and transmitting, by the first data storage device and in response to a determination that an uncorrectable error occurred, a request to the second data storage device to mark the block as uncorrectable; and marking, by the second data storage device, the block as uncorrectable in response to the request.

Example 66 includes the subject matter of any of Examples 51-65, and further including determining, by the processor, whether the second data storage device has been disconnected; transmitting, by the processor and in response to a determination that the second data storage device has been disconnected, an administrative request to the first data storage device to discontinue the move operation; and suspending, by the first data storage device and in response to the administrative request, the move operation.

Example 67 includes the subject matter of any of Examples 51-66, and further including determining, by the processor, whether a storage device has been added; awaiting, by the processor and in response to a determination that a storage device has been added, completion of the move operation; and notifying, by the processor and in response to completion of the move operation, the storage devices of the added storage device.

Example 68 includes one or more computer-readable storage media comprising a plurality of instructions that, when executed by a compute device, cause the compute device to perform the method of any of Examples 51-67.

Example 69 includes a compute device comprising means for transmitting, with a processor of a compute device, a move request to a first data storage device of the compute device, wherein the move request identifies a block of data to be moved from the first data storage device to a second data storage device of the compute device; means for transmitting, with the first data storage device and in response to the move request, a completion notification to the processor; means for reading, with the first data storage device and after transmitting the completion notification, the block of data from a first non-volatile memory of the first data storage device to a volatile memory of the compute device; means for transmitting, with the first data storage device to the second data storage device, a second move request to move the block of data; and means for writing, with the second data storage device and in response to the second move request, the block of data from the volatile memory to a second non-volatile memory of the second data storage device.

Example 70 includes the subject matter of Example 69, and further including means for removing, with the first data storage device, from the first non-volatile memory, the block after the block has been written to the second non-volatile memory of the second data storage device.

Example 71 includes the subject matter of any of Examples 69 and 70 and further including means for deallocating, with the first data storage device, from the volatile memory, the block after the block has been written to the second non-volatile memory of the second data storage device.

Example 72 includes the subject matter of any of Examples 69-71, and further including means for transmitting, with the first data storage device and in response to the first move request from the processor, a lock request to provide exclusive access to a logical address of the block to the second data storage device; and means for locking, with the second data storage device and in response to the lock request, the logical address in the second non-volatile memory.

Example 73 includes the subject matter of any of Examples 69-72, and further including means for unlocking, with the second data storage device, the logical address after the block has been written to the second non-volatile memory.

Example 74 includes the subject matter of any of Examples 69-73, and wherein the means for transmitting the lock request comprises means for writing the lock request to a command queue allocated to the second data storage device; and means for writing an update to a message signaled interrupt (MSI) allocated to the second data storage device to trigger an interrupt.

Example 75 includes the subject matter of any of Examples 69-74, and further including means for writing, with the first data storage device, the move request to the first non-volatile memory prior to a power loss condition; means for detecting, with the first data storage device, the move request in the first non-volatile memory after the power loss condition has occurred; and means for resuming, with the first data storage device and in response to the detection of the move request in the first non-volatile memory, the move of the block.

Example 76 includes the subject matter of any of Examples 69-75, and further including means for detecting, with the processor, the first data storage device and the second data storage device; means for assigning, with the processor, identifiers to each of the first data storage device and the second data storage device; means for allocating, with the processor, memory resources to the first data storage device and the second data storage device; and means for notifying, with the processor, the first data storage device and the second data storage device of each other.

Example 77 includes the subject matter of any of Examples 69-76, and wherein the means for assigning identifiers to each of the first data storage device and the second data storage device comprises means for concatenating a serial number, a model number, and a vendor identifier for each of the first data storage device and the second data storage device.

Example 78 includes the subject matter of any of Examples 69-77, and wherein the means for allocating the memory resources comprises means for allocating a message signaled interrupt (MSI) for each storage device; and means for allocating a request submission queue and a request completion queue for each storage device.

Example 79 includes the subject matter of any of Examples 69-78, and wherein the means for notifying the first data storage device and the second data storage device of each other comprises means for providing the identifiers and the MSIs of the storage devices to the storage devices.

Example 80 includes the subject matter of any of Examples 69-79, and wherein the means for transmitting the first move request comprises means for writing the move request to a command queue allocated to the first data storage device; and means for writing an update to a message signaled interrupt (MSI) allocated to the first data storage device to trigger an interrupt.

Example 81 includes the subject matter of any of Examples 69-80 and the compute device of Example 68, further including means for registering, with the first data storage device and after receipt of the first move request, the first move request for power loss protection.

Example 82 includes the subject matter of any of Examples 69-81, and wherein the means for transmitting the second move request comprises means for writing the second move request to a command queue allocated to the second data storage device; and means for writing an update to a message signaled interrupt (MSI) allocated to the second data storage device to trigger an interrupt.

Example 83 includes the subject matter of any of Examples 69-82, and further including means for determining, with the first data storage device, whether an uncorrectable error occurred during the read of the block; means for transmitting, with the first data storage device and in response to a determination that an uncorrectable error occurred, a request to the second data storage device to mark the block as uncorrectable; and means for marking, with the second data storage device, the block as uncorrectable in response to the request.

Example 84 includes the subject matter of any of Examples 69-83, and further including means for determining, with the processor, whether the second data storage device has been disconnected; means for transmitting, with the processor and in response to a determination that the second data storage device has been disconnected, an administrative request to the first data storage device to discontinue the move operation; and means for suspending, with the first data storage device and in response to the administrative request, the move operation.

Example 85 includes the subject matter of any of Examples 69-84, and further including means for determining, with the processor, whether a storage device has been added; means for awaiting, with the processor and in response to a determination that a storage device has been added, completion of the move operation; and means for notifying, with the processor and in response to completion of the move operation, the storage devices of the added storage device.

The invention claimed is:

1. A data storage subsystem for providing cross data storage device communication for a move operation, the data storage subsystem comprising:
   a first data storage device including a first non-volatile memory; and
   a second data storage device including a second non-volatile memory;
   wherein the first data storage device is to:

transmit, in response to a move request that identifies a block of data to be moved from the first data storage device to the second data storage device, a completion notification to a processor;

read, after transmitting the completion notification, the block of data from the first non-volatile memory to a volatile memory; and transmit, to the second data storage device, a second move request to move the block of data; and the second data storage device is to:

write, in response to the second move request, the block of data from the volatile memory to the second non-volatile memory of the second data storage device.

2. The data storage subsystem of claim 1, wherein the first data storage device is further to remove, from the first non-volatile memory, the block of data after the block of data has been written to the second non-volatile memory of the second data storage device.

3. The data storage subsystem of claim 1, wherein the first data storage device is further to deallocate, from the volatile memory, the block of data after the block of data has been written to the second non-volatile memory of the second data storage device.

4. The data storage subsystem of claim 1, wherein:

the first data storage device is further to transmit, in response to the move request, a lock request to provide exclusive access to a logical address of the block of data to the second data storage device; and the second data storage device is further to lock, in response to the lock request, the logical address in the second non-volatile memory.

5. The data storage subsystem of claim 4, wherein the second data storage device is further to unlock the logical address after the block of data has been written to the second non-volatile memory.

6. The data storage subsystem of claim 4, wherein to transmit the lock request comprises to:

write the lock request to a command queue allocated to the second data storage device; and write an update to a message signaled interrupt (MSI) allocated to the second data storage device to trigger an interrupt.

7. The data storage subsystem of claim 1, wherein the first data storage device is further to:

write the move request to the first non-volatile memory prior to a power loss condition; and detect the move request in the first non-volatile memory after the power loss condition has occurred.

8. The data storage subsystem of claim 1, wherein the first data storage device is further to register, after receipt of the move request, the move request for power loss protection.

9. The data storage subsystem of claim 1, wherein to transmit the second move request comprises to:

write the second move request to a command queue allocated to the second data storage device; and write an update to a message signaled interrupt (MSI) allocated to the second data storage device to trigger an interrupt.

10. The data storage subsystem of claim 1, wherein:

the first data storage device is further to:

determine whether an uncorrectable error occurred during the read of the block of data; and transmit, in response to a determination that an uncorrectable error occurred, a request to the second data storage device to mark the block of data as uncorrectable; and the second data storage device is further to mark the block of data as uncorrectable in response to the request.

11. The data storage subsystem of claim 1, wherein the first non-volatile memory and the second non-volatile memory are NAND memory.

12. One or more non-transitory machine-readable storage media comprising a plurality of instructions that, when executed by a data storage subsystem, cause the data storage subsystem to:

transmit, with a first data storage device and in response to a move request that identifies a block of data to be moved from the first data storage device to a second data storage device, a completion notification to a processor;

read, with the first data storage device and after transmitting the completion notification, the block of data from a first non-volatile memory of the first data storage device to a volatile memory;

transmit, with the first data storage device to the second data storage device, a second move request to move the block of data; and write, with the second data storage device and in response to the second move request, the block of data from the volatile memory to a second non-volatile memory of the second data storage device.

13. The one or more non-transitory machine-readable storage media of claim 12, wherein the plurality of instructions, when executed, further cause the data storage subsystem to remove, with the first data storage device, from the first non-volatile memory, the block of data after the block of data has been written to the second non-volatile memory of the second data storage device.

14. The one or more non-transitory machine-readable storage media of claim 12, wherein the plurality of instructions, when executed, further cause the data storage subsystem to deallocate, with the first data storage device, from the volatile memory, the block of data after the block of data has been written to the second non-volatile memory of the second data storage device.

15. The one or more non-transitory machine-readable storage media of claim 12, wherein the plurality of instructions, when executed, further cause the data storage subsystem to:

transmit, with the first data storage device and in response to the move request from the processor, a lock request to provide exclusive access to a logical address of the block of data to the second data storage device; and lock, with the second data storage device and in response to the lock request, the logical address in the second non-volatile memory.

16. The one or more non-transitory machine-readable storage media of claim 15, wherein the plurality of instructions, when executed, further cause the data storage subsystem to unlock, with the second data storage device, the logical address after the block of data has been written to the second non-volatile memory.

17. The one or more non-transitory machine-readable storage media of claim 15, wherein to transmit the lock request comprises to:

write the lock request to a command queue allocated to the second data storage device; and write an update to a message signaled interrupt (MSI) allocated to the second data storage device to trigger an interrupt.

18. The one or more non-transitory machine-readable storage media of claim 12, wherein the plurality of instructions, when executed, further cause the data storage subsystem to:

write, with the first data storage device, the move request to the first non-volatile memory prior to a power loss condition; and detect, with the first data storage device, the move request in the first non-volatile memory after the power loss condition has occurred.

19. The one or more non-transitory machine-readable storage media of claim 12, wherein the plurality of instructions, when executed, further cause the data storage subsystem to register, with the first data storage device and after receipt of the move request, the move request for power loss protection.

20. The one or more non-transitory machine-readable storage media of claim 12, wherein to transmit the second move request comprises to:

write the second move request to a command queue allocated to the second data storage device; and write an update to a message signaled interrupt (MSI) allocated to the second data storage device to trigger an interrupt.

21. The one or more non-transitory machine-readable storage media of claim 12, wherein the plurality of instructions, when executed, further cause the data storage subsystem to:

determine, with the first data storage device, whether an uncorrectable error occurred during the read of the block of data; and transmit, with the first data storage device and in response to a determination that an uncorrectable error occurred, a request to the second data storage device to mark the block of data as uncorrectable; and mark, with the second data storage device, the block of data as uncorrectable in response to the request.

22. A method for providing cross data storage device communication for a move operation, the method comprising:

transmitting, by a first data storage device and in response to a move request that identifies a block of data to be moved from the first data storage device to a second data storage device, a completion notification to a processor;

reading, by the first data storage device and after transmitting the completion notification, the block of data from a first non-volatile memory of the first data storage device to a volatile memory;

transmitting, by the first data storage device to the second data storage device, a second move request to move the block of data; and writing, by the second data storage device and in response to the second move request, the block of data from the volatile memory to a second non-volatile memory of the second data storage device.

23. The method of claim 22, further comprising removing, by the first data storage device, from the first non-volatile memory, the block of data after the block of data has been written to the second non-volatile memory of the second data storage device.

24. The method of claim 22, further comprising deallocating, by the first data storage device, from the volatile memory, the block of data after the block of data has been written to the second non-volatile memory of the second data storage device.

25. The method of claim 22, further comprising:

transmitting, by the first data storage device and in response to the move request from the processor, a lock request to provide exclusive access to a logical address of the block of data to the second data storage device; and locking, by the second data storage device and in response to the lock request, the logical address in the second non-volatile memory.

* * * * *